United States Patent
Liu et al.

(10) Patent No.: US 6,225,189 B1
(45) Date of Patent: May 1, 2001

(54) METHOD OF FABRICATING SHALLOW TRENCH ISOLATION STRUCTURE

(75) Inventors: Chun-Liang Liu; Hsien-Liang Meng, both of Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/282,019

(22) Filed: Mar. 29, 1999

(30) Foreign Application Priority Data

Mar. 6, 1999 (TW) .................................................. 88103454

(51) Int. Cl.⁷ .................................................. H01L 21/762
(52) U.S. Cl. ............................................. 438/435; 438/778
(58) Field of Search ..................................... 438/778, 424, 438/427, 435

(56) References Cited

U.S. PATENT DOCUMENTS

| | | | |
|---|---|---|---|
| 5,051,380 | * 9/1991 | Maeda et al. | ............. 438/761 |
| 5,786,262 | * 7/1998 | Jang et al. | ............. 438/424 |
| 5,817,567 | * 10/1998 | Jang et al. | ............. 438/427 |
| 5,891,810 | * 4/1999 | Park et al. | ............. 438/778 |

* cited by examiner

Primary Examiner—Olik Chaudhuri
Assistant Examiner—Anh Duy Mai
(74) Attorney, Agent, or Firm—Jiawei Huang; J C Patents

(57) ABSTRACT

A method of fabricating a shallow trench isolation structure is described. A mask layer is formed on a substrate. The mask layer and the substrate are patterned to form a trench in the substrate. A first deposition step and a second deposition step are performed to form a first isolation layer over the substrate. A third deposition step is performed to form a second isolation layer on the first isolation layer. The second isolation layer has a greater fluidity than the first isolation layer has. A planarization process is performed with the mask layer serving as a stop layer. A portion of the first isolation layer and the mask layer are removed to form the shallow trench isolation structure.

14 Claims, 2 Drawing Sheets

METHOD OF FABRICATING SHALLOW TRENCH ISOLATION STRUCTURE

CROSS-REFERENCE TO RELATED APPLICATION

This application claims the priority benefit of Taiwan application serial no. 88103454, filed Mar. 6, 1999, the full disclosure of which is incorporated herein by reference.

BACKGROUND OF THE INVENTION

1. Field of the Invention

The present invention relates to a semiconductor fabricating method. More particularly, the present invention relates to a method of fabricating an isolation region.

2. Description of the Related Art

An isolation region is formed in an integrated circuit for the purpose of separating neighboring device regions of a substrate and preventing the carriers from penetrating through the substrate to neighboring devices. For example, isolation regions are used to isolate field effect transistors (FETs) from each other in order to prevent current leakage among the FETs. Conventionally, local oxidation of silicon (LOCOS) technique is widely utilized in semiconductor industry to provide the isolation regions among the various devices in the substrate. However, there are still some drawbacks, such as internal stress generation and bird's beak encroachment, in the LOCOS process. Shallow trench isolation (STI) has become widely used in highly integrated devices because STI is scaleable and has no bird's beak encroachment problem as found in the conventional LOCOS technique.

In the fabrication process of the STI structure, an isolation layer is deposited to fill the trench and then a chemical-mechanical polishing step is performed in order to obtain a planarized surface. However, because self-planarization of the isolation layer is poor, it is easy to obtain surface having a deep step height after chemical-mechanical polishing.

In the conventional method of forming the shallow trench isolation, the surface having a deep step height over the substrate causes dishing in the isolation layer. Because electrons easily gather in the recessed isolation layer, which is arising from dishing, the threshold voltage of devices is decreased and the abnormal sub-threshold current is likely to occur. The aforementioned problem is called a kink effect, which degrades the device quality and decreases the throughput.

SUMMARY OF THE INVENTION

The invention provides a method of fabricating a shallow trench isolation (STI) structure. A mask layer is formed on a substrate. The mask layer and the substrate are patterned to form a trench in the substrate. A first deposition step and a second deposition step are performed to form a first isolation layer over the substrate. A third deposition step is performed to form a second isolation layer on the first isolation layer. A planarization process is performed with the mask layer serving as a stop layer. A portion of the first isolation layer and the mask layer are removed to form the STI structure.

The fluidity of the second isolation layer is greater than the fluidity of the second isolation layer. Thus, the second isolation layer has a good gap-filling ability. A planarized surface over the substrate is obtained after the second isolation layer is formed. A highly planarized surface can be further obtained after the following chemical-mechanical polishing. Additionally, in the present invention, neither the kink effect nor the abnormal sub-threshold current occur.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
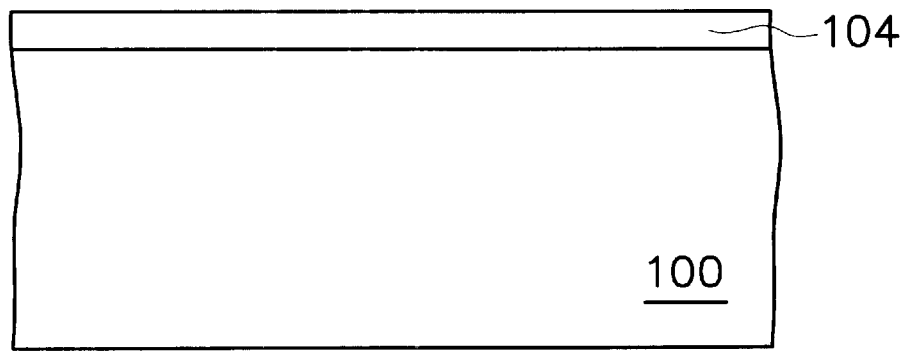
FIGS. 1 through 5 are schematic, cross-sectional views showing a method of fabricating a STI structure according to one preferred embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

In FIG. 1, a pad oxide layer (not shown) is formed on a substrate 100 by, for example, thermal oxidation. A mask layer 104 is formed on the substrate 100. The material of the mask layer 104 includes silicon nitride. The mask layer 104 is formed by, for example, low pressure chemical vapor deposition.

Figure 2:
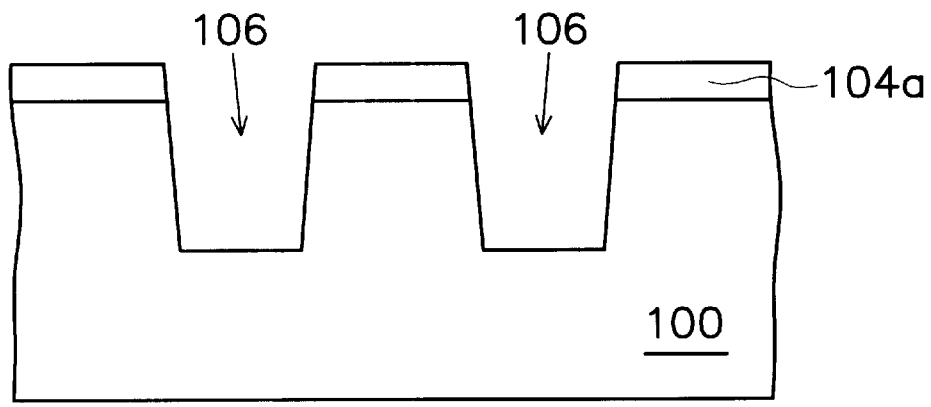

In FIG. 2, the mask layer 104 and the pad oxide layer are patterned by a photolithography and etching process. The mask layer 104, the pad oxide layer, and the substrate 100 are patterned by a photolithography and etching process to form trenches 106 on the substrate 100 as shown in FIG. 2. Mask layer 104 is thus converted into mask layer 104a.

Figure 3:
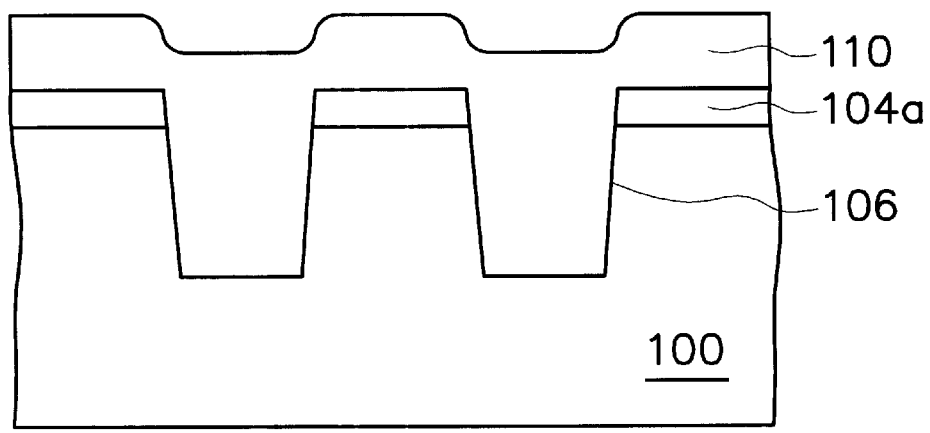

In FIG. 3, first and second deposition processes are performed to form an isolation layer 110, such as a silicon dioxide layer. The first and the second deposition processes are performed by atmospheric-pressure chemical vapor deposition (APCVD) with ozone and tetra-ethyl-ortho-silicate (TEOS) as a source gas. In the first deposition step, preferably, the concentration of ozone is about 5 to 40 g/m$^3$ and the deposition temperature is about 440° C. to 500° C. In the second depositing process, preferably, the concentration of ozone is about 80 g/m$^3$ to 140 g/m$^3$ and the deposition temperature is about 440° C. to 500° C. The thick isolation layer 110 is formed on the mask layer 104a to fill the trenches 106. Because the isolation layer 110 formed by the above-motioned steps has poor fluidity, the isolation layer 110 has a high step height. Thus, it is difficult to obtain a planarized surface on a chip.

Figure 4:
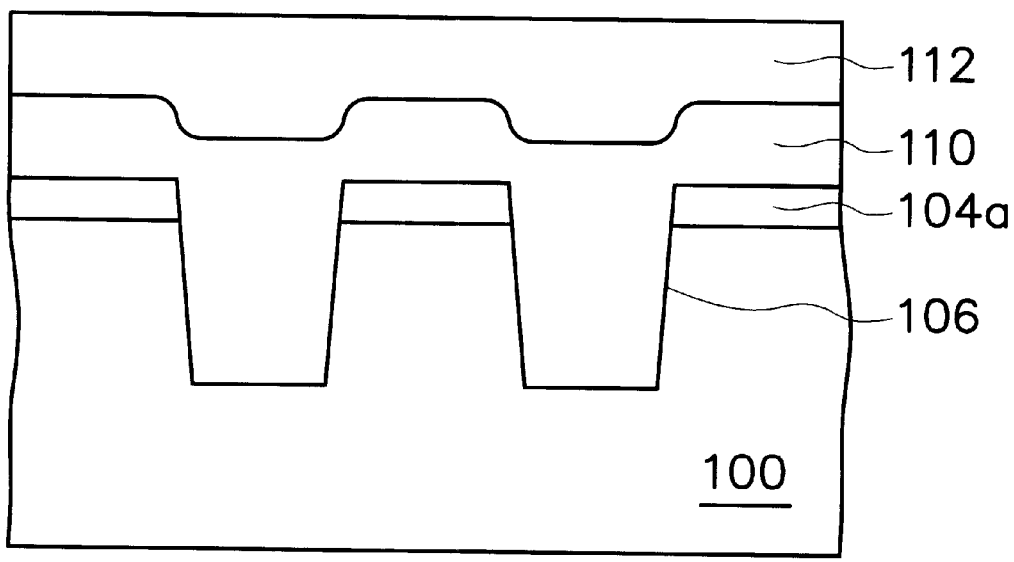

In FIG. 4, a third depositing process is performed by the following exemplary step. An isolation layer 112, such as a silicon dioxide layer, is deposited by APCVD with ozone, which has a preferred concentration of about 80 g/m$^3$ to 140 g/m$^3$, and tetraethyl-ortho-silicate (TEOS) serving as a source gas at a preferred temperature of about 380° C. to 420° C. The second isolation layer 1 12, which has a greater fluidity than the isolation layer 110 has, is formed on the isolation layer 110. Because the isolation layer 112 has a good gap-filling ability, a planarized surface is formed after the isolation layer 112 is formed.

Figure 5:
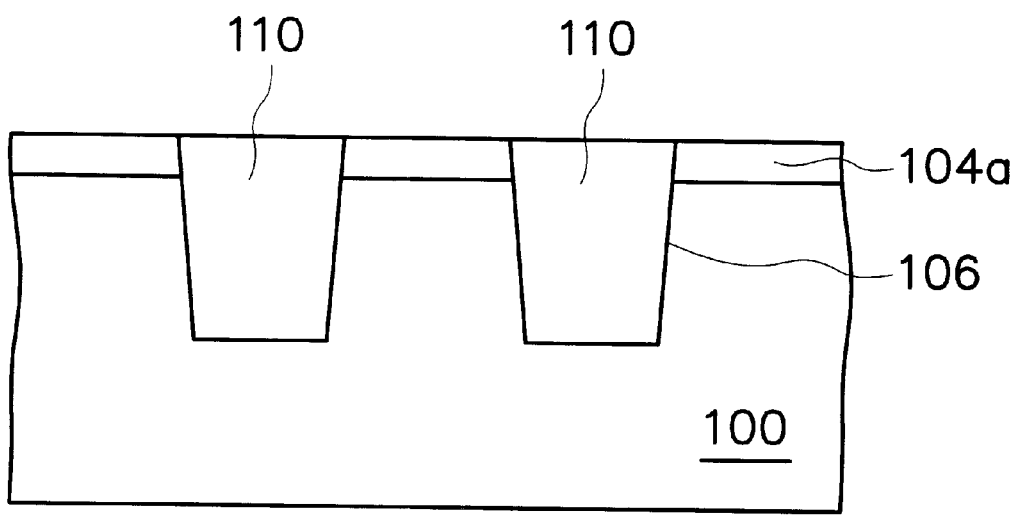

In FIG. 5, a planarization step, such as an etching step or a chemical-mechanical polishing step, is performed with the mask layer 104a serving as a stop layer. The isolation layer 112 (shown in FIG. 4) and a portion of the isolation layer 110 are removed by the planarization step. The remaining isolation layer 110 fills the trench 106 so that the surface of the remaining isolation layer 110 is level with the surface of the mask layer 104a. The dishing of the substrate 100 does not occur. Then, some follow-up steps are performed to remove a portion of the remaining isolation layer 110 and the mask layer 104a to complete a STI structure.

The second isolation layer is more fluid than the first isolation layer. Thus, the second isolation layer provides a good gap-filling ability. The planarized surface on the chip is obtained after the second isolation layer is formed. A highly planarized surface is further obtained after the following planarization step. In the present invention, there is no dishing effect, so that neither the kink effect nor the abnormal sub-threshold current occur.

It will be apparent to those skilled in the art that various modifications and variations can be made to the structure and the method of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a shallow trench isolation structure, comprising the steps of:
   forming a mask layer on a substrate;
   patterning the mask layer and the substrate to form a trench in the substrate;
   performing a first deposition step and a second deposition step under a first temperature to form a first isolation layer over the substrate and fill the trench; and
   performing a third deposition step under a second temperature to form a second isolation layer on the first isolation layer, wherein the second isolation layer has a greater fluidity than the first isolation layer has and the second temperature is lower than the first temperature;
   performing a planarization step with the mask layer serving as a stop layer; and
   removing a portion of the first isolation layer and the mask layer.

2. The method of claim 1, wherein the first deposition step is performed by atmospheric-pressure chemical vapor deposition with ozone and tetra-ethyl-ortho-silicate serving as a source gas.

3. The method of claim 1, wherein the second deposition step is performed by atmospheric-pressure chemical vapor deposition with ozone and tetra-ethyl-ortho-silicate serving as a source gas.

4. The method of claim 1, wherein the third deposition step is performed by atmospheric-pressure chemical vapor deposition with ozone and tetra-ethyl-ortho-silicate serving as a source gas.

5. The method of claim 2, wherein the first deposition step is performed with ozone having a concentration of about 5 $g/m^3$ to 40 $g/m^3$ at about 440° C. to 500° C.

6. The method of claim 3, wherein the second deposition step is performed with ozone having a concentration of about 80 $g/m^3$ to 140 $g/m^3$ at about 440° C. to 500° C.

7. The method of claim 4, wherein the third deposition step is performed with ozone having a concentration of about 80 $g/m^3$ to 140 $g/m^3$ at about 380° C. to 420° C.

8. The method of claim 1, wherein the planarization step comprises chemical-mechanical polishing.

9. The method of claim 1, wherein the planarization step comprises etching.

10. A method of fabricating a shallow trench isolation structure, comprising the steps of:
    forming a mask layer on a substrate;
    patterning the mask layer and the substrate to form a trench in the substrate;
    performing a first deposition step and a second deposition step to form a first isolation layer over the substrate and fill the trench, wherein the first deposition step and the second deposition step are performed by atmospheric-pressure chemical vapor deposition with ozone and tetra-ethyl-ortho-silicate serving as a source gas, the first deposition step is performed with ozone having a concentration of about 5 $g/m^3$ to 40 $g/m^3$ at about 440° C. to 500° C., and the second deposition step is performed with ozone having a concentration of about 80 $g/m^3$ to 140 $g/m^3$ at about 440° C. to 500° C.; and
    performing a third deposition step to form a second isolation layer on the first isolation layer, wherein the third deposition step is performed by atmospheric-pressure chemical vapor deposition with ozone and tetra-ethyl-ortho-silicate serving as a source gas, and the third deposition step is performed with ozone having a concentration of about 80 $g/m^3$ to 140 $g/m^3$ at about 380° C. to 420° C.

11. The method of claim 10, further comprising performing a planarization step with the mask layer serving as a stop layer.

12. The method of claim 11, wherein the planarization step comprises chemical-mechanical polishing.

13. The method of claim 11, wherein the planarization step comprises etching.

14. The method of claim 10, wherein further comprise removing a portion of the first isolation layer and the mask layer to form the shallow trench isolation structure.

* * * * *